United States Patent
Pfeuffer

(10) Patent No.: US 9,329,254 B2
(45) Date of Patent: May 3, 2016

(54) MAGNETIC RESONANCE METHOD AND SYSTEM TO CORRECT PHASE INFORMATION IN MR IMAGES

(75) Inventor: Josef Pfeuffer, Kunreuth (DE)

(73) Assignee: Siemens Aktiengesellschaft, Munich (DE)

( * ) Notice: Subject to any disclaimer, the term of this patent is extended or adjusted under 35 U.S.C. 154(b) by 817 days.

(21) Appl. No.: 13/422,271

(22) Filed: Mar. 16, 2012

(65) Prior Publication Data

US 2012/0249138 A1 Oct. 4, 2012

(30) Foreign Application Priority Data

Mar. 28, 2011 (DE) .......................... 10 2011 006 230

(51) Int. Cl.
- *G01R 33/48* (2006.01)
- *G01R 33/565* (2006.01)
- *G01R 33/561* (2006.01)
- *G01R 33/567* (2006.01)

(52) U.S. Cl.
CPC ...... *G01R 33/56563* (2013.01); *G01R 33/5616* (2013.01); *G01R 33/5676* (2013.01); *G01R 33/56509* (2013.01)

(58) Field of Classification Search
CPC .................... G01R 33/56509; G01R 33/5616; G01R 33/56563; G01R 33/5676
USPC ..................... 324/307, 309; 600/410; 382/131
See application file for complete search history.

(56) References Cited

U.S. PATENT DOCUMENTS

| | | | |
|---|---|---|---|
| 6,118,273 A | 9/2000 | Takizawa et al. | |
| 6,586,935 B1 | 7/2003 | Ma et al. | |
| 6,853,191 B1 | 2/2005 | Miller et al. | |
| 7,689,262 B2 | 3/2010 | Kruger et al. | |
| 2002/0167319 A1 | 11/2002 | Ikezaki | |
| 2003/0023154 A1 | 1/2003 | Nitz | |
| 2005/0218893 A1 | 10/2005 | Kumai et al. | |
| 2007/0182411 A1* | 8/2007 | Bammer et al. | 324/307 |
| 2007/0249929 A1* | 10/2007 | Jeong et al. | 600/410 |
| 2012/0008842 A1* | 1/2012 | Hinks | G01R 33/56554 382/131 |
| 2012/0146640 A1* | 6/2012 | Kusahara et al. | 324/309 |

OTHER PUBLICATIONS

Pfeuffer, J., Van de Moortele, P.-F., Ugurbil, K., Hu, X. and Glover, G. H. (2002), Correction of physiologically induced global off-resonance effects in dynamic echo-planar and spiral functional imaging. Magn Reson Med, 47: 344-353. doi: 10.1002/mrm.10065.*

(Continued)

*Primary Examiner* — Dixomara Vargas
*Assistant Examiner* — Rishi Patel
(74) *Attorney, Agent, or Firm* — Schiff Hardin LLP

(57) ABSTRACT

In a magnetic resonance (MR) method and system for correction of phase information in MR images of a predetermined volume segment of an examination subject, a basic magnetic field is applied and MR data of the predetermined volume segment are acquired and evaluated such that phase information is calculated for each image element of the predetermined volume segment. A navigator signal is acquired that detects an unintentional change of the basic magnetic field that is caused by movements of the examination subject or by the magnetic resonance system itself. The phase information is corrected with this navigator signal.

16 Claims, 4 Drawing Sheets

(56) References Cited

OTHER PUBLICATIONS

C. Liu et al., "Simultaneous phase correction and SENSE reconstruction for navigated multi-shot DWI with non-cartesian k-space sampling," Magn. Reson. Med., 54, 2005, S. 1412-1422.

D.H.J. Poot et al., "Improved B0 field map estimation for high field EPI," Magn. Reson. Imag. 28, 2010, S. 441-450.

Sunil Kumar Arja et al., "Changes in fMRI magnitude data and phase data observed in block-design and event-related tasks," NeuroImage 49 (2010) 3149-3160.

Gisela E. Hagberg et al., "The effect of physiological noise in phase functional magnetic resonance imaging: from blood oxygen level-dependent effects to direct detection of neuronal currents," Magnetic Resonance Imaging 26 (2008) 1026-1040.

Tuong Huu Le et al., "Retrospective estimation and correction of physiological fluctuation in functional MRI," Magnetic Resonance in Medicine 35, 290-298 (1996).

J. Pfeuffer et al., "Dynamic Phase Echo-Planar Imaging—Detection and Correction of Dynamic Off-Resonance," ISMRM abstract 2011.

Josef Pfeuffer et al., "Correction of Physiologically Induced Global Off-Resonance Effects in Dynamic Echo-Planar and Spiral Functional Imaging," Magnetic Resonance in Medicine 47, 344-353 (2002).

Qing-San Xiang et al., "Correction for Geometric Distortion and N/2 Ghosting in EPI by Phase Labeling for Additional Coordinate Encoding (PLACE)," Magnetic Resonance in Medicine 57, 731-741 (2007).

Durand et al., "Artifact Due to B0 Fluctuations in fMRI: Correction Using the k-Space Central Line," Magnetic Resonance in Medicine, vol. 46 (2001), pp. 198-201.

* cited by examiner a)

b)

c)

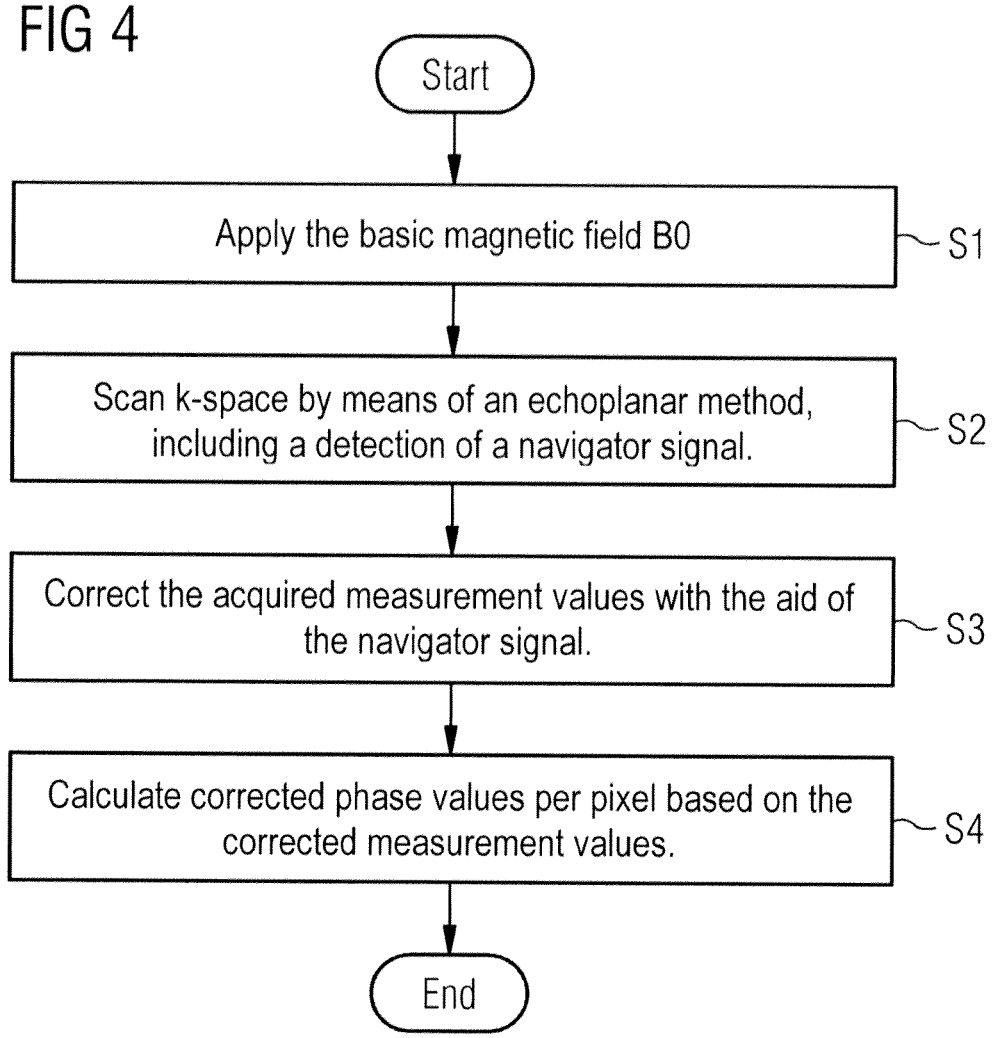

MAGNETIC RESONANCE METHOD AND SYSTEM TO CORRECT PHASE INFORMATION IN MR IMAGES

BACKGROUND OF THE INVENTION

1. Field of the Invention

The present invention concerns a method in order to correct the phase information in the creation of magnetic resonance (MR) images that have been acquired with an echoplanar method. Moreover, the present invention concerns a correspondingly designed magnetic resonance system.

2. Description of the Prior Art

Functional MR imaging (fMRI), in which the oxygen saturation of blood is depicted, for example, is a popular method in order to non-invasively study the active brain, for example. The oxygen saturation of the blood changes depending on local activation in the brain, and the T2* relaxation time changes, and so the acquired MR data change, based on this changing oxygen saturation. The complex-value fMRI signals thus contain physiological information.

The underlying requirement for an analysis by means of fMRI is the stability of the measured MR signals, both spatially and temporally. These requirements also apply for other applications, for example in the generation of MR images with which a diffusion or perfusion map is presented. The spatial stability (i.e. the assumption that a predetermined magnetic field strength respectively prevails at a defined location of the examination subject) can be disrupted, for example, by breathing or the heartbeat or by a movement of the examination subject. The temporal stability (i.e. the assumption that a predetermined magnetic field strength prevails at a defined location at a defined point in time or during a predetermined time interval) can be disrupted, for example, by a corresponding drift of the magnetic resonance system.

SUMMARY OF THE INVENTION

An object of the present invention is to better correct disruptions of the stability than is the case according to the prior art.

Within the scope of the present invention, a method is provided to correct a phase information in MR images of a predetermined volume segment of an examination subject by means of a magnetic resonance system, wherein the basic magnetic field (B0) is applied and MR data of the predetermined volume segment are acquired, by scanning (making entries to complex numbers into) k-space that corresponds with the predetermined volume segment.

The MR data are evaluated such that phase information is calculated for each pixel of the predetermined volume segment. For example, in addition to amplitude information, or in addition to an amplitude value, a corresponding phase value thus exists for each pixel.

A navigator signal is acquired, with which an (unintentional) variation of the basic magnetic field is detected that, for example, is caused by the examination subject or by corresponding inadequacies (drift) of the magnetic resonance system itself.

The phase information is corrected using this navigator signal such that the effect of the unintentional change of the basic magnetic field is taken into account in the phase information.

Because the phase information is corrected according to the invention (rather than only the magnitude information, as is typical in the prior art) such that unintentional changes of the basic magnetic field are computationally eliminated or corrected, disruptions of the stability are better corrected than is the case according to the prior art.

According to the prior art, for example, in functional MR imaging only the amplitude information is correspondingly corrected depending on the unintended changes of the basic magnetic field and is used to derive the physiological information. According to the invention, it is now also possible to correct the phase information in the image region with regard to the changes of the basic magnetic field, such that the correspondingly corrected phase information of the MR data, and thus the entirety of the complex multi-value information (phase information and amplitude information) are also advantageously provided as physiological information in the image region.

In order to correct the phase information in the image region, the correction can take place in k-space (in that the k-space signal is corrected) or in image space (for example after the transformation of the k-space entries into MR image data).

The correction can be conducted in real time so that the corresponding MR image (which represents the corrected phase information) can also be created in real time.

The acquisition of the MR data is preferably implemented with an echoplanar method (pulse sequence). In the echoplanar method, one or more echo signals are read out, starting from a single, selective RF excitation. As used herein an echoplanar method also means a method in which k-space is scanned with a spiral trajectory, or in a non-Cartesian manner (not in straight lines).

Starting from an RF excitation, multiple lines (or paths, for example given a sinusoidally oscillating gradient field) in k-space or even the entirety of k-space are/is scanned by means of the echoplanar method, such that k-space is advantageously scanned faster (in terms of the amount of time) in comparison to other methods in which only one line of k-space is scanned per RF pulse. The echoplanar method is therefore well suited for functional MR imaging, for example to acquire short-term changes in the brain.

According to one embodiment of the invention, k-space that corresponds to the predetermined volume segment to be scanned is scanned in segments. The unintentional change of the basic magnetic field that is detected with the navigator signal is thereby accounted for separately in the acquisition of the MR data of each segment in order to correct the MR data of the respective segment depending on the detected change of the basic magnetic field before a combined reconstruction (in particular of the phase information of the MR data of the segments) takes place.

Because the MR data of each segment of k-space are corrected individually before the MR data of k-space are combined and used for reconstruction, artifacts can be markedly reduced in comparison to an approach in which the MR data of k-space are corrected as a whole.

Either internal navigator signals or external navigator signals can be used as the aforementioned navigator signal. An internal navigator signal is an MR signal that is detected either additionally (by specific reference lines being additionally detected, for example) or implicitly (by MR signals from the k-space center being used, for example) within the scanning of k-space. According to the invention, the k-space signal that is acquired in the normal scan can accordingly also at the same time be an internal navigator signal, such that no additional MR signal must be acquired for detection of the navigator signal. The internal navigator signals can also be used for other corrections (for example image duplications in the phase coding direction; "ghosting"). An external navigator signal is a signal that is detected with a breathing belt (a device with which the breathing activity is detected) or with a heart monitor. An external navigator signal with which information about dynamic frequency changes of the basic magnetic field can be detected also can be detected with magnetic field probes and a corresponding calibration.

According to a further embodiment of the invention, the phase information is corrected depending on a first reference phase value, a second reference phase value, a first phase value, and a second phase value. To acquire these phase values, the transverse magnetization is detected with a navigator signal that is not phase-coded. Expressed differently, the free induction decay is measured (detected) with the navigator signal. The first reference phase value is measured within the scope of a reference measurement with the navigator signal at a first time interval after the RF excitation pulse, while the second reference phase value is determined using the navigator signal in that the transverse magnetization of the echo signal resulting from the navigator signal is measured at a second time interval after the RE excitation pulse in the center of k-space given the reference measurement. The first phase value is determined by detecting the transverse magnetization with an arbitrary measurement signal that is not phase-coded using the free induction decay after the first time interval after the corresponding RF excitation within the scope of a normal measurement. The second phase value is determined by detecting the transverse magnetization of the echo signal that results from the measurement signal at the second time interval after the RF excitation in the center of k-space within the scope of the normal measurement.

According to this embodiment, since both the reference phase value at two points in time and the phase value at the same two points in time are detected, to correct the change of the basic magnetic field both the offset and a linear variation of this change per time unit are taken into account.

Since the detection of the reference phase values in the embodiments described above entails a change of the pulse sequence, an embodiment also exists in which only one reference phase value is determined by detecting the transverse magnetization of a resulting echo signal at a time interval after the RF excitation pulse in the center of k-space in a reference measurement, and with only one phase value being determined by detecting the transverse magnetization of a resulting echo signal after this time interval after the RF excitation pulse in the center of k-space in the actual measurement. In this simplified embodiment, the phase information is corrected depending only on the reference phase value and the phase value.

According to this simplified embodiment, only the linear variation per unit of time (and not the offset) is taken into account in the correction of the change of the basic magnetic field.

According to the invention, the correction of the phase information provides improvement in the creation of MR images. The detected change of the basic magnetic field can also, however, be used to correct the amplitude information or magnitude information that is calculated for each pixel of the predetermined volume segment from the MR data. For this purpose, the detected change of the basic magnetic field can already be taken into account in the acquisition of the MR data in k-space or in the evaluation (reconstruction) of the MR data in image space, in order to also correspondingly correct the amplitude information.

To create a distortion map, k-space can be scanned a first time and subsequently a second time, with an echoplanar method being used in both cases. In comparison to the second scan, a phase coding gradient of the echoplanar method has a small additional gradient moment (i.e. the moment has an amplitude that is smaller in terms of its magnitude in comparison to the actual amplitude of the phase coding gradient) from which a constant shift in k-space takes place in the direction corresponding to the phase coding gradient between the results of the first scan and the second scan. The distortion map is created by calculating, for each pixel, a phase difference between the results of the first scan and the results of the second scan. The effects of the unintended changes of the magnetic field are thereby corrected according to the invention in the calculation of the phase difference. The distortion map thus indicates how a phase value of the corresponding pixel is to be corrected for each pixel of the predetermined volume segment in order to correct the detected change of the basic magnetic field.

To create a field map, k-space can be scanned after a first echo time and after a second echo time (thus twice). A first phase map is thereby created using the MR data that are acquired at the first echo time, and a second phase map is created from the MR data that are acquired at the second echo time. The phase map indicates, on a pixel-by-pixel basis, which phase value has been calculated for the corresponding pixel. The phase values are thereby corrected according to the invention so that the phase information of the two phase maps take into account the detected change of the basic magnetic field. The field map is created from the difference of the first phase map and the second phase map, and indicates for each pixel how strong the basic magnetic field is for that pixel.

By use of the present invention to create a field map, physiological artifacts can be eliminated from the field map, for example.

Within the scope of the present invention, a magnetic resonance system is also provided to acquire MR image data. The magnetic resonance system has a basic field magnet, a gradient field system, an RF antenna; and a control device in order to control the gradient field system and the RF antenna, to receive measurement signals acquired by the RF antenna, and to evaluate these measurement signals and thus to create MR images. For this purpose, the basic field magnet applies a basic magnetic field and the gradient field system is operated to acquire MR data from the predetermined volume segment. The magnetic resonance system evaluates the acquired MR data and calculates phase information for each pixel of the predetermined volume segment. The magnetic resonance system detects a navigator signal that is dependent on an unintended change of the basic magnetic field, and the magnetic resonance system corrects the phase information using this navigator signal.

The advantages of the magnetic resonance system according to the invention essentially correspond to the advantages of the method according to the invention that have been described above.

The present invention also encompasses a non-transitory, computer-readable data storage medium that, when loaded into a computerized control and evaluation system of a magnetic resonance imaging system, causes the magnetic resonance imaging system to implement any or all of the embodiments of the method described above.

The programming instructions (software) can be source code (C++, for example) that must still be compiled (translated) and linked or that must only be interpreted, or can be executable software code that has only to be loaded into the corresponding computer for execution.

The electronically readable data storage medium can be a DVD, a magnetic tape or a USB stick, for example, on which is stored electronically readable control information, in particular software (see above).

The present invention is particularly suitable for functional MR imaging, to generate diffusion-weighted MR images or to generate perfusion-weighted MR images. Naturally, the present invention is not limited to this preferred field of application since the present invention can be used to advantage in any application in which the results depend on correct phase information. Methods in the field of functional MR imaging with which (for example) relationships between specific areas of the brain are depicted through the processing of defined information acquired from the brain, and MR imaging of functional connections ("connectivity mapping") also benefit from the present invention because not only the amplitude but also the phase is corrected according to the invention. In general, MR imaging methods are improved with regard to stability and image quality according to the invention by unintentional, dynamic temporal and spatial changes of the basic magnetic field being detected and corrected with regard to the phase information.

BRIEF DESCRIPTION OF THE DRAWINGS

FIG. 4 is a flowchart of an embodiment of the method according to the invention.

DESCRIPTION OF THE PREFERRED EMBODIMENTS

Figure 1:
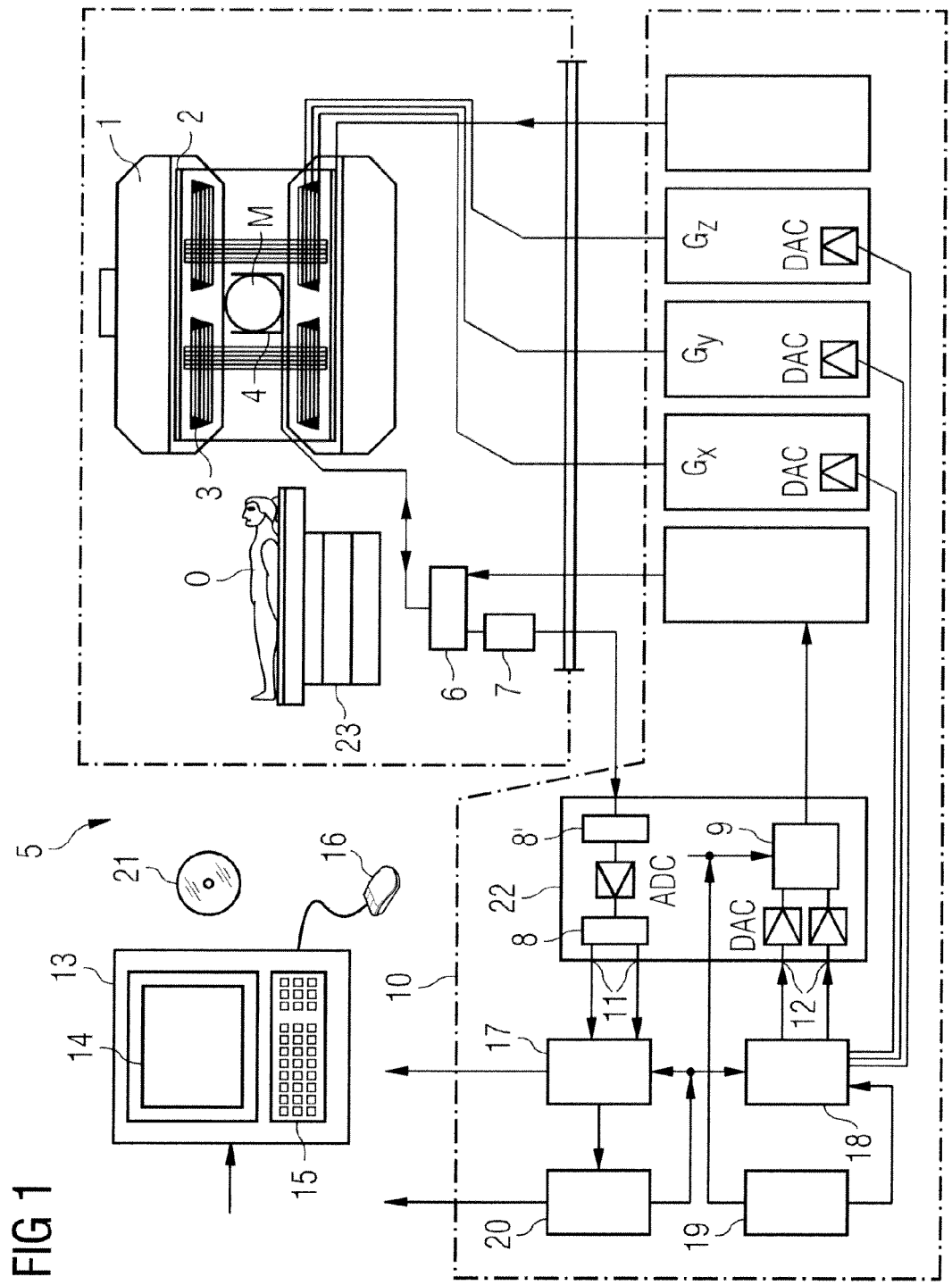
FIG. 1 schematically illustrates a magnetic resonance system according to the invention.

FIG. 1 is a schematic representation of a magnetic resonance system 5 (a magnetic resonance imaging or magnetic resonance tomography apparatus). A basic magnetic field 1 generates a temporally constant, strong magnetic field for polarization or alignment of the nuclear spins in an examination region of a subject O, for example of a portion of a human body (the head, for example) that is to be examined. The subject O is situated on a table 23 that is moved into the magnetic resonance system 5 for data acquisition. The high homogeneity of the basic magnetic field that is required for the magnetic resonance measurement is defined in a typically spherical measurement volume M. Shim plates made of ferromagnetic material are mounted at a suitable point to assist the homogeneity requirements, and in particular to eliminate temporally invariable influences. Temporally variable influences are eliminated by shim coils 2.

A cylindrical gradient coil system 3 composed of three sub-windings is used in the basic field magnet 1. The sub-windings are supplied with current by respective amplifiers to generate a linear (and temporally variable) gradient field in the respective directions of the Cartesian coordinate system. The first sub-winding of the gradient field system 3 generates a gradient Gx in the x-direction, the second sub-winding generates a gradient Gy in the y-direction, and the third sub-winding generates a gradient Gz in the z-direction. Each amplifier includes a digital/analog converter that is activated by a sequence controller 18 for generation of the gradient pulses with the desired timing.

One (or more) radio-frequency antennas 4, that convert the radio-frequency pulses emitted by a radio-frequency power amplifier into an alternating magnetic field for excitation of the nuclei and alignment of the nuclear spins of the subject O to be examined or of the region of the subject O that is to be examined, are located within the gradient field system 3. Each radio-frequency antenna 4 has one or more RF transmission coils and one or more RF reception coils in the form of an annular, advantageously linear or matrix-like arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coils of the respective radio-frequency antenna 4 into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and an imaginary part to a digital/analog converter in the radio-frequency system 22 via respective inputs 12, and from the digital/analog converter to the transmission channel 9. In the transmission channel 9, the pulse sequences are modulated on a radio-frequency carrier signal whose base frequency corresponds to the resonance frequency of the nuclear spins in the measurement volume.

Switching from transmission operation to reception operation takes place via a transmission/reception diplexer 6. The RF transmission coils of the radio-frequency antenna(s) 4 radiate(s) the radio-frequency pulses for excitation of the nuclear spins into the measurement volume M and scans resulting echo signals via the RF reception coil(s). The correspondingly acquired magnetic resonance signals are phase-sensitively demodulated at an intermediate frequency in the reception channel 8' (first demodulator) of the radio-frequency system 22 and digitized in an analog/digital converter (ADC). This signal is further demodulated to a frequency of 0. The demodulation to a frequency of 0 and the separation into real part and imaginary part occurs in a second demodulator 8 after the digitization in the digital domain. An MR image can be reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. In particular, the sequence controller 18 controls the timed switching of the gradients, the emission of the radio-frequency pulses with defined phase amplitude, and the reception of the magnetic resonance signals. The time base for the radio-frequency system 22 and the sequence controller 18 is provided by a synthesizer 19. The selection of corresponding control programs to generate an MR image (which control programs are stored on a DVD 21, for example) and the presentation of the generated MR image take place via a terminal 13, that has a keyboard 15, a mouse 16 and a monitor 14.

Figure 2:
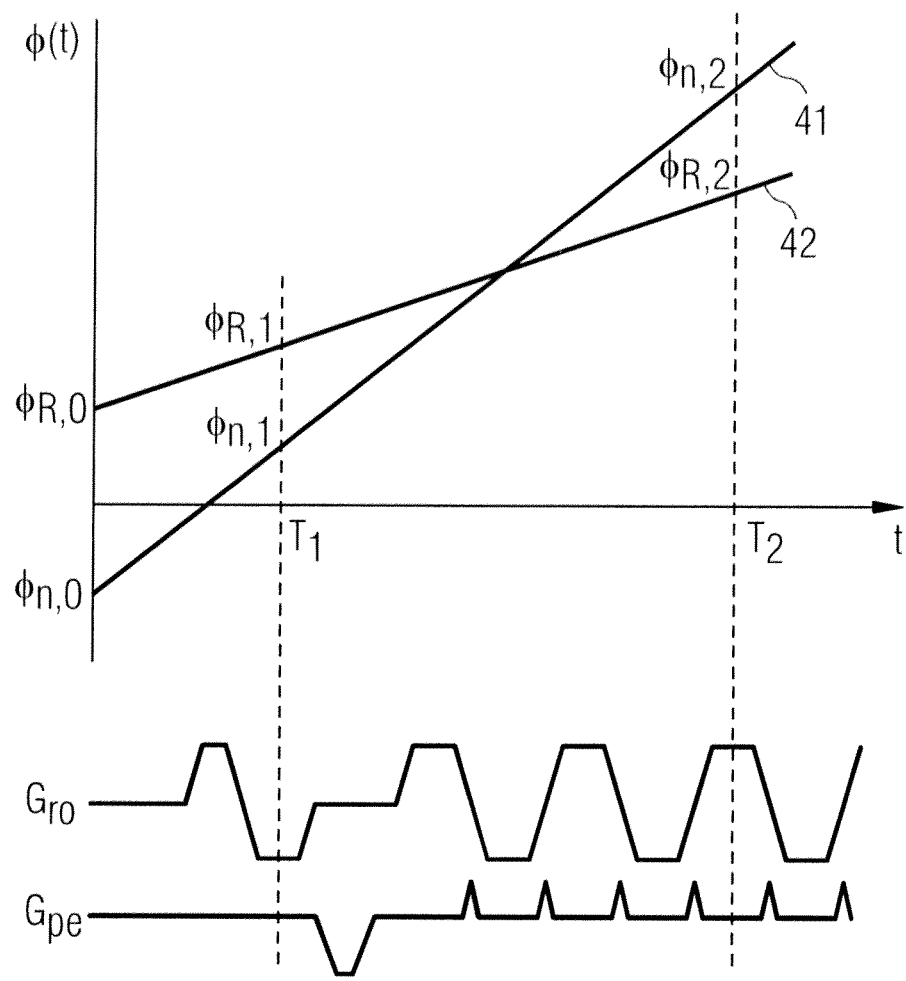
FIG. 2 shows the phase over time for a reference measurement and a normal measurement in an echoplanar method.

The phase $\phi(t)$ of the signal acquired in k-space over time t is shown in FIG. 2 for a reference measurement 42 and for a normal measurement 41 to acquire MR data, wherein the MR data are acquired with an echoplanar method. For this purpose, the readout gradient Gro and the phase coding gradient Gpe are depicted with the same time scale. According to the assumed model, the phase value changes linearly over time due to the unintentional change of the basic magnetic field, such that two measurement points are necessary at different points in time in order to determine a phase value (at the point in time 0) and a frequency offset, the phase value φ is measured in that the transversal magnetization is measured with a non-phase-coded navigator signal (a signal responding to the free induction decay) at a first point in time after the RF excitation and an echo signal generated by the corresponding navigator signal in the center of k-space at a later, second point in time. In both cases, a signal is scanned that is integrated over the entire slice to be acquired. The navigator signal can also be coded in the readout direction if the echo signal is acquired in the k-space center. In practice, the navigator signal and the echo signal for the reference measurement are detected using the signal maximum and used for all following measurements.

With the use of the following Equation (1), the phase difference $\Delta\phi$ at the point in time 0 can be determined from the phase values $\phi_{R,1}$ and $\phi_{n,1}$ at the point in time T1 and the phase values $\phi_{R,2}$ and $\phi_{n,2}$ at the point in time T2 of the reference measurement 42 and the actual measurement 41.

$$\Delta\phi = (T_2 \cdot (\phi_{n,1} - \phi_{R,1}) - T_1 \cdot (\phi_{n,2} - \phi_{R,2}))/(T_2 - T_1) \quad (1)$$

From these same phase values and points in time (time intervals), the frequency change (gradient [slope] change) $\Delta\omega$ between the frequency (gradient of the phase) of the reference measurement and the frequency (gradient) of the actual measurement can be determined according to the following Equation (2).

$$\Delta\omega = ((\phi_{n,2} - \phi_{R,2}) - (\phi_{n,1} - \phi_{R,1}))/(T_2 - T_1) \quad (2)$$

Using the phase difference $\Delta\phi$ and the frequency change $\Delta\omega$, the signal acquired in k-space during the actual measurement can be corrected according to the following Equation (3) by the multiplication with a factor F depending on the time t.

$$F(t) = e^{-i(\Delta\phi + \Delta\omega \cdot t)} \quad (3)$$

According to a simplified correction, only the echo signal in the k-space center is acquired for the reference measurement 42, and the actual measurement 41 is acquired at a point in time T (corresponding to the second interval T2). Via the following Equation (4), the frequency change (gradient change) $\Delta\omega$ between the frequency (gradient) of the reference measurement 42 and the frequency (gradient) of the actual measurement 41 can be determined from the phase values $\phi_R$, $\phi_n$ detected in such a manner and the time interval T.

$$\Delta\omega = (\phi_R - \phi_n)/T \quad (4)$$

According to the following Equation (5), the k-space signal can be corrected with the frequency change $\Delta\omega$ via the multiplication with a factor F dependent on the time t.

$$F(t) = e^{-i \cdot \Delta\omega \cdot t} \quad (5)$$

The simplified correction assumes that the phase difference $\Delta\phi$ remains essentially constant during the measurements (sampling of k-space).

For example, by means of a voxel-by-voxel Fourier transformation of the predetermined volume segment that corresponds with k-space in which the k-space signals are acquired, an amplitude value and a phase value are now determined from the k-space signal corrected with the term according to Equation (3) or according to Equation (5). In other words: a phase information, namely the phase value per voxel of the predetermined volume segment, is also corrected accordingly via the two corrections described in the preceding.

Figure 3:
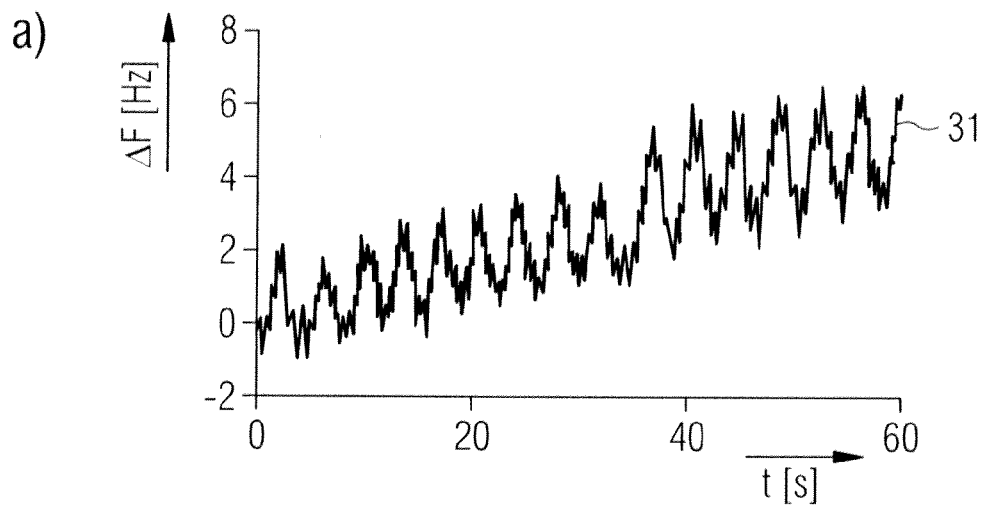
FIG. 3 shows the relationship between the navigator frequency and a phase value and a spectrum.
Figure 3:
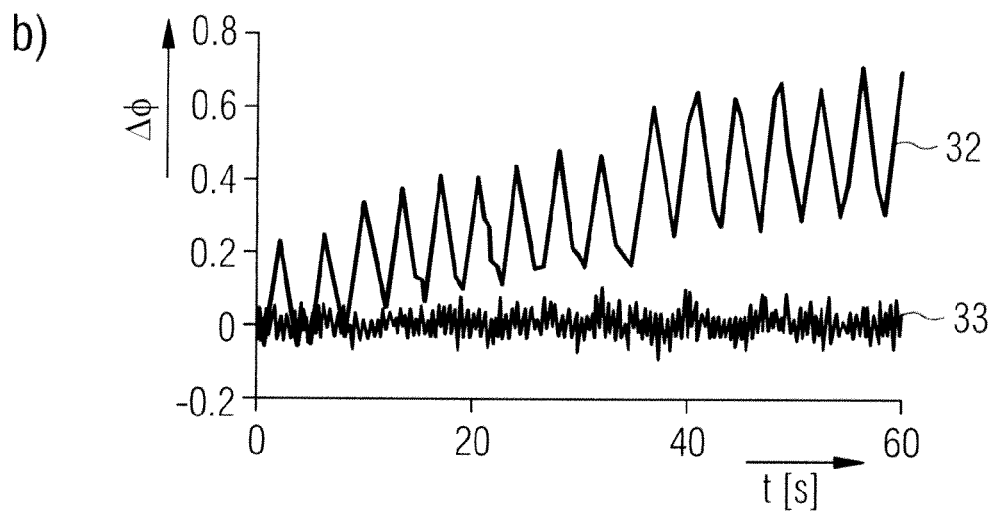
Figure 3:
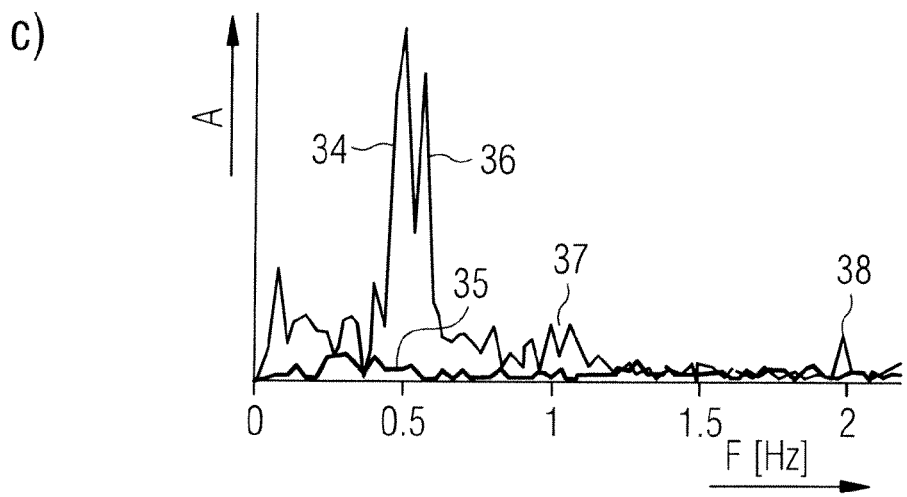

Results of the present invention are shown in FIG. 3. The curve of a navigator frequency 31 (i.e. of a frequency change detected with a navigator signal) is shown over time in FIG. 3A. This navigator frequency 31 essentially corresponds to the frequency change $\Delta\omega$ described above.

A mean value of the phase values of the voxels of the predetermined volume segment over time is shown in FIG. 3B without correction according to the invention 32 and with correction according to the invention 33. It is apparent that the curve without correction 32 largely corresponds to the detected frequency change 31 in FIG. 3A.

A spectrum of the measurement signals acquired in k-space is shown without correction according to the invention 34 and with correction according to the invention 35 in FIG. 3c. Artifacts due to the breathing 36, the heart beat 37 and due to the cooling head 38 of the magnetic resonance system are eliminated via the correction according to the invention.

A flowchart of an embodiment of the method according to the invention is shown in FIG. 4.

The basic magnetic field B0 is applied in a first Step S1.

In the following Step S2, k-space which corresponds to the predetermined volume segment to be scanned is subsequently scanned with the aid of an echoplanar method, wherein a navigator signal is also detected.

Using the results which are detected via the navigator signal, in Step S3 the k-space measurement values are corrected directly, or the MR data derived from said k-space measurement values are corrected in image space.

In Step S4, the phase values (and also the amplitude values) are calculated per pixel of the predetermined volume segment based on the corrected k-space measurement values or the corrected MR data.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to correct phase information in magnetic resonance (MR) images of a volume segment of an examination subject, comprising;

placing an examination subject in an MR data acquisition unit and operating the MR data acquisition unit to apply a basic magnetic field at least to a predetermined volume segment of the examination subject and to acquire MR data from the predetermined volume segment, said MR data representing image elements of said predetermined volume segment;

detecting a navigator signal originating within said MR data acquisition unit during acquisition of said MR data;

in a processor, evaluating said MR data to calculate phase information for each of said image elements of said predetermined volume segment;

in said processor, using said navigator signal to determine a change in said basic magnetic field caused by a source selected from the group consisting of movement of the examination subject, and said MR data acquisition unit itself;

determining a first reference phase value by detecting transverse magnetization in said examination subject in a reference measurement in which said navigator signal is not phase coded, using free induction decay, during a first time interval after said RF excitation;

determining a second reference phase value by transverse magnetization of an echo signal resulting from said navigator signal being detected in a center of k-space in said reference measurement at a second time interval after said RF excitation;

determining a first phase value by detecting the transverse magnetization in a measurement with a measurement signal that is not phase coded using the free induction decay after said first time interval after said RF excitation;

determining a second phase value by detecting the transverse magnetization of an echo signal resulting from the measurement signal during said measurement in the center of k-space after a second time interval after the RF excitation;

correcting said MR data during entry thereof into k-space dependent on said first reference phase value, said second reference phase value, said first phase value and said second phase value;

determining a factor F dependent on time t according to $$F(t)=e^{-i(\Delta\phi+\Delta\omega \cdot t)},$$

wherein $\Delta\phi$ and $\Delta\omega$ are calculated according to $$\Delta\phi=(T_2 \cdot (\phi_{n,1}-\phi_{R,1})-T_1 \cdot (\phi_{n,2}-\phi_{R,2}))/(T_2-T_1),$$

$$\Delta\omega=((\phi_{n,2}-\phi_{R,2})-(\phi_{n,1}-\phi_{R,1}))/(T_2-T_1),$$

wherein $\phi_{R,1}$ is the first reference phase value, $\phi_{R,2}$ is the second reference phase value, $\phi_{n,1}$ is the first phase value, $\phi_{r,2}$ is the second phase value, $T_1$ is the first time interval and $T_2$ is the second time interval;

correcting the MR data by multiplying the MR data with the factor F at time t; and from said processor, making said MR data with the corrected phase information available in electronic form at an output of said processor, as a data file.

2. A method as claimed in claim 1 comprising operating said MR data acquisition unit with an echo planar method to acquire said MR data from said predetermined volume segment, with a selective radio frequency (RF) excitation of said predetermined volume segment and readout of at least one echo signals in said echo planar method.

3. A method as claimed in claim 2 comprising entering said MR data into k-space respectively in segments of k-space, detecting said change of said basic magnetic field with said navigator signal separately during acquisition of said MR data for each of the respective segments of k-space, and correcting said phase information respectively in said segments of k-space, before reconstructing an image from an entirety of the MR data in all segments of k-space.

4. A method as claimed in claim 1 comprising detecting said navigator signal with a device that interacts with the examination subject, said device being selected from the group consisting of a breathing belt and a heart monitor.

5. A method as claimed in claim 1 comprising:
in said processor, evaluating said MR data by calculating amplitude information for each image element of said predetermined volume segment; and
correcting said amplitude information also dependent on said change in said basic magnetic field detected by said navigator signal.

6. A method as claimed in claim 1 comprising further processing said MR data in a further processing algorithm selected from the group consisting of functional magnetic resonance imaging analysis, magnetic resonance imaging of functional connections, reconstructing a diffusion-weighted MR image, and reconstructing a profusion-weighted MR image.

7. A method as claimed in claim 1 comprising acquiring said MR data by operating said MR data acquisition unit with an echo planar measurement and entering said MR data into k-space a first time followed by a second time with said echo planar method;

compared to said first entry of data into k-space, in said second entry of data into k-space generating a phase coding gradient in said echo planar method that has a smaller gradient moment than for said first entry of said MR data into k-space, with a constant shift in k-space along a direction corresponding to said phase coding gradient being implemented between said first entry of said MR data into k-space and said second entry of said MR data into k-space; and determining an image element-by-image element difference between said first entry of said MR data into k-space and said second entry of said MR data into k-space that indicates a degree to which a phase value for the respective image element is dependent on said determined change in said basic magnetic field.

8. A method as claimed in claim 1 comprising acquiring said MR data by operating said MR data acquisition unit with an echo planar method that includes a first echo time and a second echo time;

acquiring said MR data after said first echo time and entering said MR data acquired after said first echo time into k-space;

acquiring MR data after said second echo time and entering said MR data acquired after said second echo time into k-space;

generating a first phase map from said MR data entered into k-space after said first echo time, and generating a second phase map from said MR data entered into k-space after said second echo time, each phase map identifying a phase value for each image element represented by said MR data; and determining a difference between said first phase map and said second phase map, and using said difference, and a known mathematical relationship between phase and magnetic field strength, to generate a field map that identifies a strength of said basic magnetic field for each of said image elements.

9. A magnetic resonance (MR) system comprising:
an MR data acquisition unit configured to receive an examination subject therein, said MR data acquisition unit comprising a basic field magnet;
a control unit configured to operate the MR data acquisition unit to apply a basic magnetic field, with said basic field magnet, at least to a predetermined volume segment of the examination subject and to acquire MR data from the predetermined volume segment, said MR data representing image elements of said predetermined volume segment;
a processor configured to evaluate said MR data to calculate phase information for each of said image elements of said predetermined volume segment;
a navigator signal detector that detects a navigator signal originating within said MR data acquisition unit while acquiring said MR data;
said processor being configured to use said navigator signal to determine a change in said basic magnetic field caused by a source selected from the group consisting of movement of the examination subject, and said MR data acquisition unit itself;
said processor being configured to determine a first reference phase value by detecting transverse magnetization in said examination subject in a reference measurement in which said navigator signal is not phase coded, using free induction decay, during a first time interval after said RF excitation;
said processor being configured to determine a second reference phase value by transverse magnetization of an echo signal resulting from said navigator signal being detected in a center of k-space in said reference measurement at a second time interval after said RF excitation;

said processor being configured to determine a first phase value by detecting the transverse magnetization in a measurement with a measurement signal that is not phase coded using the free induction decay after said first time interval after said RF excitation;

said processor being configured to determine a second phase value by detecting the transverse magnetization of an echo signal resulting from the measurement signal during said measurement in the center of k-space after a second time interval after the RF excitation;

said processor being configured to correct said MR data during entry thereof into k-space dependent on said first reference phase value, said second reference phase value, said first phase value and said second phase value;

said processor being configured to determine a factor F dependent on time t according to $$F(t)=e^{-i(\Delta\phi+\Delta\omega \cdot t)},$$

wherein $\Delta\phi$ and $\Delta\omega$ are calculated according to $$\Delta\phi=(T_2 \cdot (\phi_{n,1}-\phi_{R,1})-T_1 \cdot (\phi_{n,2}-\phi_{R,2}))/(T_2-T_1),$$

$$\Delta\omega=((\phi_{n,2}-\phi_{R,2})-(\phi_{n,1}-\phi_{R,1}))/(T_2-T_1),$$

wherein $\phi_{R,1}$ is the first reference phase value, $\phi_{R,2}$ is the second reference phase value, $\phi_{n,1}$ is the first phase value, $\phi_{n,2}$ is the second phase value, $T_1$ is the first time interval, and $T_2$ is the second time interval;

said processor being configured to correct the MR data by multiplying the MR data with the factor F at time t; and said processor being configured to make said MR data with the corrected phase information available at an output of said processor in electronic form, as a data file.

10. A non-transitory, computer-readable data storage medium encoded with programming instructions, said data storage medium being loaded into a computerized control and evaluation unit of a magnetic resonance (MR) system that comprises an MR data acquisition unit, having a basic field magnet, and a computerized control and evaluation system, said programming instructions causing said control and evaluation system of said magnetic resonance imaging system to:

operate the MR data acquisition unit to apply a basic magnetic field, with said basic field magnet, at least to a predetermined volume segment of an examination subject in the MR data acquisition unit and to acquire MR data from the predetermined volume segment, said MR data representing image elements of said predetermined volume segment;

evaluate said MR data to calculate phase information for each of said image elements of said predetermined volume segment;

receive a navigator signal detected within said data acquisition unit while said MR data were acquired;

use said navigator signal to determine a change in said basic magnetic field caused by a source selected from the group consisting of movement of the examination subject, and said MR data acquisition unit itself;

determine a first reference phase value by detecting transverse magnetization in said examination subject in a reference measurement in which said navigator signal is not phase coded, using free induction decay, during a first time interval after said RF excitation;

determine a second reference phase value by transverse magnetization of an echo signal resulting from said navigator signal being detected in a center of k-space in said reference measurement at a second time interval after said RF excitation;

determine a first phase value by detecting the transverse magnetization in a measurement with a measurement signal that is not phase coded using the free induction decay after said first time interval after said RF excitation;

determine a second phase value by detecting the transverse magnetization of an echo signal resulting from the measurement signal during said measurement in the center of k-space after a second time interval after the RF excitation;

correct said MR data during entry thereof into k-space dependent on said first reference phase value, said second reference phase value, said first phase value and said second phase value;

determine a factor F dependent on time t according to $$F(t)=e^{-i(\Delta\phi+\Delta\omega \cdot t)},$$

wherein $\Delta\phi$ and $\Delta\omega$ are calculated according to $$\Delta\phi=(T_2 \cdot (\phi_{n,1}-\phi_{R,1})-T_1 \cdot (\phi_{n,2}-\phi_{R,2}))/(T_2-T_1),$$

$$\Delta\omega=((\phi_{n,2}-\phi_{R,2})-(\phi_{n,1}-\phi_{R,1}))/(T_2-T_1),$$

wherein $\phi_{R,1}$ is the first reference phase value, $\phi_{R,2}$ is the second reference phase value, $\phi_{n,1}$ is the first phase value, $\phi_{n,2}$ is the second phase value, $T_1$ is the first time interval, and $T_2$ is the second time interval;

correct the MR data by multiplying the MR data with the factor F at time t; and make said MR data with the corrected phase information available at an output of said control and evaluation system in electronic form, as a data file.

11. A method as claimed in claim 1 comprising operating said MR data acquisition unit to detect said navigator signal.

12. A magnetic resonance system as claimed in claim 9 wherein said navigator signal detector is a device selected from the group consisting of a breathing belt and a heart monitor.

13. A magnetic resonance system as claimed in claim 9 wherein said control unit is configured to operate said MR data acquisition unit as said navigator signal detector.

14. A method to correct phase information in magnetic resonance (MR) images of a volume segment of an examination subject, comprising;

placing an examination subject in an MR data acquisition unit and operating the MR data acquisition unit to apply a basic magnetic field at least to a predetermined volume segment of the examination subject and to acquire MR data from the predetermined volume segment, said MR data representing image elements of said predetermined volume segment;

detecting a navigator signal originating within said MR data acquisition unit during acquisition of said MR data;

in a processor, evaluating said MR data to calculate phase information for each of said image elements of said predetermined volume segment;

in said processor, using said navigator signal to determine a change in said basic magnetic field caused by a source selected from the group consisting of movement of the examination subject, and said MR data acquisition unit itself;

said processor being configured to determine a reference phase value by detecting transverse magnetization in said predetermined volume segment of a resulting echo signal in a reference measurement at a center of k-space at a time interval after said RF excitation;
said processor being configured to determine a phase value by detecting the transverse magnetization of a resulting echo signal in said measurement in said center of k-space after said time interval after said RF excitation;
said processor being configured to correct said MR data during entry of said MR data into k-space dependent on said reference phase value and said phase value;
said processor being configured to determine a factor F dependent on time t according to $$F = e^{-i \cdot \Delta \omega \cdot t},$$

wherein $\Delta \omega$ is calculated according to $$\Delta \omega = (\phi_R - \phi_n)/T,$$

wherein $\phi_R$ is the reference phase value, $\phi_n$ is the phase value and T is the time interval;
said processor being configured to correct the MR data by multiplying the MR data with the factor F at time t; and
from said processor, making said MR data with the corrected phase information available in electronic form at an output of said processor, as a data file.

15. A magnetic resonance (MR) system comprising:
an MR data acquisition unit configured to receive an examination subject therein, said MR data acquisition unit comprising a basic field magnet;
a control unit configured to operate the MR data acquisition unit to apply a basic magnetic field, with said basic field magnet, at least to a predetermined volume segment of the examination subject and to acquire MR data from the predetermined volume segment, said MR data representing image elements of said predetermined volume segment;
a processor configured to evaluate said MR data to calculate phase information for each of said image elements of said predetermined volume segment;
a navigator signal detector that detects a navigator signal originating within said MR data acquisition unit while acquiring said MR data;
said processor being configured to use said navigator signal to determine a change in said basic magnetic field caused by a source selected from the group consisting of movement of the examination subject, and said MR data acquisition unit itself;
said processor being configured to determine a reference phase value by detecting transverse magnetization in said predetermined volume segment of a resulting echo signal in a reference measurement at a center of k-space at a time interval after said RF excitation;
said processor being configured to determine a phase value by detecting the transverse magnetization of a resulting echo signal in said measurement in said center of k-space after said time interval after said RF excitation;
said processor being configured to correct said MR data during entry of said MR data into k-space dependent on said reference phase value and said phase value;
said processor being configured to determine a factor F dependent on time t according to $$F = e^{-i \cdot \Delta \omega \cdot t},$$

wherein $\Delta \omega$ is calculated according to $$\Delta \omega = (\phi_R - \phi_n)/T,$$

wherein $\phi_R$ is the reference phase value, $\phi_n$ is the phase value and T is the time interval;
said processor being configured to correct the MR data by multiplying the MR data with the factor F at time t; and
said processor being configured to make said MR data with the corrected phase information available at an output of said processor in electronic form, as a data file.

16. A non-transitory, computer-readable data storage medium encoded with programming instructions, said data storage medium being loaded into a computerized control and evaluation unit of a magnetic resonance (MR) system that comprises an MR data acquisition unit, having a basic field magnet, and a computerized control and evaluation system, said programming instructions causing said control and evaluation system of said magnetic resonance imaging system to:
operate the MR data acquisition unit to apply a basic magnetic field, with said basic field magnet, at least to a predetermined volume segment of an examination subject in the MR data acquisition unit and to acquire MR data from the predetermined volume segment, said MR data representing image elements of said predetermined volume segment;
evaluate said MR data to calculate phase information for each of said image elements of said predetermined volume segment;
receive a navigator signal detected within said data acquisition unit while said MR data were acquired;
use said navigator signal to determine a change in said basic magnetic field caused by a source selected from the group consisting of movement of the examination subject, and said MR data acquisition unit itself;
determine a reference phase value by detecting transverse magnetization in said predetermined volume segment of a resulting echo signal in a reference measurement at a center of k-space at a time interval after said RF excitation;
determine a phase value by detecting the transverse magnetization of a resulting echo signal in said measurement in said center of k-space after said time interval after said RF excitation;
correct said MR data during entry of said MR data into k-space dependent on said reference phase value and said phase value;
determine a factor F dependent on time t according to $$F = e^{-i \Delta \omega \cdot t},$$

wherein $\Delta \omega$ is calculated according to $$\Delta \omega = (\phi_R - \phi_n)/T,$$

wherein $\phi_R$ is the reference phase value, $\phi_n$ is the phase value and T is the time interval;
correct the MR data by multiplying the MR data with the factor F at time t; and
make said MR data with the corrected phase information available at an output of said control and evaluation system in electronic form, as a data file.

* * * * *